United States Patent
Haefner

(10) Patent No.: US 8,160,184 B2
(45) Date of Patent: Apr. 17, 2012

(54) RADIO CLOCK AND METHOD FOR EXTRACTING TIME INFORMATION

(75) Inventor: Horst Haefner, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 637 days.

(21) Appl. No.: 11/604,199

(22) Filed: Nov. 27, 2006

(65) Prior Publication Data

US 2008/0107210 A1    May 8, 2008

(30) Foreign Application Priority Data

Nov. 26, 2005   (DE) .................. 10 2005 056 483

(51) Int. Cl.
*H03D 1/00* (2006.01)
*H04L 27/06* (2006.01)

(52) U.S. Cl. ........ 375/342; 375/316; 375/320; 455/349; 368/46; 368/47

(58) Field of Classification Search .................. 375/268, 375/316, 320, 342; 455/251, 344, 349; 368/46, 368/47

See application file for complete search history.

(56) References Cited

U.S. PATENT DOCUMENTS

| | | | |
|---|---|---|---|
| 4,440,501 A | 4/1984 | Schulz | |
| 5,349,570 A | 9/1994 | Kaiser | |
| 5,502,376 A * | 3/1996 | Busch | 324/166 |
| 5,528,560 A | 6/1996 | Ogiyama | |
| 5,557,440 A * | 9/1996 | Hanson et al. | 398/192 |
| 5,727,022 A * | 3/1998 | Schafer et al. | 375/238 |
| 5,805,647 A | 9/1998 | Schäfer et al. | |
| 6,288,977 B1 * | 9/2001 | Yoshida et al. | 368/47 |
| 6,714,148 B1 * | 3/2004 | Saga et al. | 341/126 |

(Continued)

FOREIGN PATENT DOCUMENTS

DE    37 33 965 A1    4/1989

(Continued)

OTHER PUBLICATIONS

Peter Hetzel, "Zeitinformation und Normalfrequenz," telecom praxis, vol. 1, 1993, pp. 25-36.

*Primary Examiner* — Shuwang Liu
*Assistant Examiner* — Sung Ahn
(74) *Attorney, Agent, or Firm* — Baker Botts L.L.P.

(57) ABSTRACT

A method for extracting time information from a received, amplitude-modulated time signal is provided. The method provides that the time signal is demodulated, the analog signal thus obtained is digitized by a comparator, and the digital signal thus obtained is analyzed to extract the time information. In addition, a characteristic value of the time duration of at least one signal phase of a specific signal level of the digital signal is compared to a target value, and a comparator threshold of the comparator is altered as a function of a result of the comparison such that the time duration of at least the applicable signal phase of the digital signal approaches the target value. In this way, an improved system sensitivity is achieved according to the invention in a receiver for receiving time signals. In particular, the frequency of occurrence of errors due to misreading of pulse lengths is reduced here, and distorted received signals are better detected as being distorted on account of their temporal deviation from the applicable target value. In addition, compensation of manufacturing tolerances of the various components in the described circuit arrangement is possible.

11 Claims, 3 Drawing Sheets

U.S. PATENT DOCUMENTS

| | | | |
|---|---|---|---|
| 7,184,479 B2* | 2/2007 | Takano et al. | 375/238 |
| 7,515,887 B2* | 4/2009 | Saitoh | 455/191.1 |
| 2004/0229582 A1* | 11/2004 | Miyasita et al. | 455/136 |
| 2005/0069051 A1* | 3/2005 | Lourens | 375/316 |
| 2005/0122952 A1 | 6/2005 | Haefner et al. | |
| 2005/0260958 A1 | 11/2005 | Haefner et al. | |
| 2007/0115759 A1* | 5/2007 | Sano | 368/47 |
| 2007/0152900 A1* | 7/2007 | Takada | 343/788 |
| 2009/0016171 A1* | 1/2009 | Fujisawa | 368/47 |

FOREIGN PATENT DOCUMENTS

| | | |
|---|---|---|
| DE | 42 37 112 A1 | 5/1993 |
| DE | 43 04 321 A1 | 8/1993 |
| DE | 43 19 946 A1 | 12/1993 |
| DE | 42 27 502 A1 | 3/1994 |
| DE | 42 33 126 A1 | 4/1994 |
| DE | 195 14 031 A1 | 10/1996 |
| DE | 198 08 431 A1 | 9/1999 |
| DE | 199 27 320 A1 | 12/2000 |
| DE | 103 57 201 A1 | 7/2005 |
| EP | 0 042 913 A2 | 1/1980 |
| EP | 1061648 A1 * | 6/2000 |

* cited by examiner

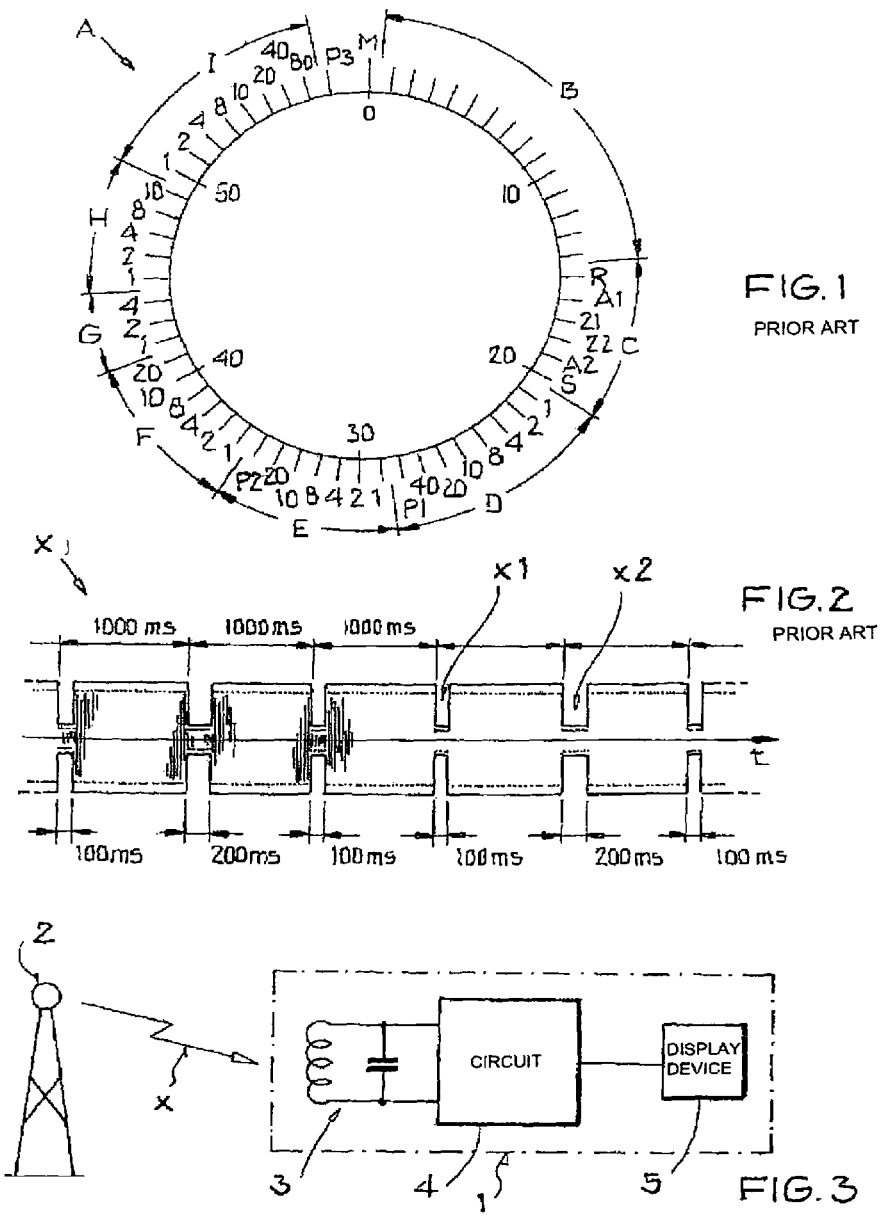

RADIO CLOCK AND METHOD FOR EXTRACTING TIME INFORMATION

This nonprovisional application claims priority under 35 U.S.C. §119(a) on German Patent Application No. DE 10 2005 056 483, which was filed in Germany on Nov. 26, 2005, and which is herein incorporated by reference.

BACKGROUND OF THE INVENTION

1. Field of the Invention

The present invention relates to a method for extracting time information from a received, amplitude-modulated time signal, wherein the time signal is demodulated, the analog signal thus obtained is digitized by a comparator, and the digital signal thus obtained is analyzed to extract the time information.

The present invention also relates to a circuit arrangement for receiving and extracting time information from amplitude-modulated time signals transmitted by a time signal transmitter, in particular for carrying out the inventive method, having a demodulator for demodulating the time signal and generating an analog signal from the time signal, having a comparator for digitizing the analog signal obtained, and having an analysis unit to extract the time information from the obtained digital signal, and also concerns an electronic clock.

2. Description of the Background Art

The radio-controlled transmission of time information is accomplished by time signals, which are emitted by appropriate transmitters, hereinafter referred to simply as time signal transmitters. A time signal is understood to mean a transmitter signal of short duration whose purpose is to transmit the time reference provided by a transmitter. This is a modulating wave, generally having multiple time markers that when demodulated represent only a single pulse that reproduces the transmitted time reference with a particular uncertainty.

The German long-wave transmitting station DCF-77, controlled by atomic frequency standards, continuously transmits amplitude-modulated long-wave time signals on the official atomic time scale CET with a power of 50 KW at the frequency 77.5 kHz. Similar transmitters exist in other countries, transmitting time information on a long-wave frequency in the range between 40 kHz to 120 kHz. All of the aforementioned countries use what is called a telegram, which is precisely one minute long, for transmitting the time information.

FIG. 1 shows the coding scheme (telegram)—labeled with reference symbol A—of the coded time information in the case of the German time signal transmitter DCF-77. The coding scheme in the present case has 59 bits, where 1 bit corresponds to one second of the time frame in each case. In this way, what is known as a time signal telegram can be transmitted over the course of one minute; it contains, in particular, information on time and date in binary encoded form. The first 15 bits B contain general coding, which contains operating information, for example. The next five bits C contain general information. Thus, R designates the antenna bit, A1 designates a flag bit for the transition from Central European Time (CET) to Central European Summer Time (CEST) and back, Z1 and Z2 designate zone time bits, A2 designates a flag bit for a leap second, and S designates a start bit for the coded time information. The time and date information is transmitted in BCD code from the 21st bit to the 60th bit, with the data applying to the next minute in each case. In this context, the bits in area D contain information on the minute, those in area E contain information on the hour, those in area F contain information on the calendar day, those in area G contain information on the week day, those in area H contain information on the month, and those in area I contain information on the calendar year. This information is present bitwise in coded form. Check bits P1, P2, P3 are provided at the end of each of the areas D, E and I. The sixtieth bit of the telegram is not occupied, and serves the purpose of indicating the start of the next frame. M designates the minute marker, and thus the start of the time signal telegram.

The structure and the bit assignment of the coding scheme shown in FIG. 1 for transmitting time signals is generally known, and is described in the article by Peter Hetzel, "Zeitinformation und Normalfrequenz," (time information and standard frequency) in Telekom Praxis, Volume 1, 1993.

Transmission of the time signal information as shown in FIG. 2 is accomplished with amplitude modulation by individual seconds markers. The modulation includes a decrease X1, X2 (or an increase) in the carrier signal X at the start of each second, with the carrier amplitude being reduced to approximately 25% of the amplitude at the beginning of each second—except for the fifty-ninth second of each minute—for a period of 0.1 seconds X1 or 0.2 seconds X2 in the case of a time signal transmitted by the DCF-77 transmitter. These decreases X1, X2 of different duration each define seconds markers or data bits in decoded form. The different durations of the seconds markers are used for binary coding of time and date, wherein seconds markers with a duration of 0.1 seconds X1 represent a binary "0" and those with a duration of 0.2 seconds X2 represent a binary "1". The following minute marker is indicated by the absence of the sixtieth seconds marker. In combination with the applicable second, analysis of the time information transmitted by the time signal transmitter is then possible. FIG. 2 uses an example to show a section of such an amplitude-modulated time signal X. However, the analysis of the precise time and precise date is only possible when the 59 second bits of a minute are unambiguously identified and thus a "0" or a "1" can be unambiguously assigned to each of these seconds markers.

In other countries, such as Great Britain, Japan, or the USA, the modulation also is accomplished by reductions or increases in the amplitude of the carrier signal X, but the seconds markers, and thus the time durations of the reductions or increases X1, X2, vary to greater or lesser degrees, and have a length from 100 ms to 800 ms, depending on the transmission protocol. In the American (WWVB) and Japanese (JJY40 and JJY60) protocols, the time proportions of the signal reductions are 50% or 80% of a full second. The level of the reduction is also different in all the protocols, ranging from complete reduction to a level of zero in Great Britain (MSF) to a reduction of only 32% of the nominal amplitude in the American transmitter (WWVB).

For general background on radio clocks and circuit arrangements for receiving time signals, reference is made to DE 198 08 431 A1, DE 43 19 946 A1, DE 43 04 321 C2, DE 42 37 112 A1, and DE 42 33 126 A1. With regard to the extraction and processing of time information from time signals, reference is made to DE 195 14 031 C2, DE 37 33 965 C2, and EP 042 913 B1.

Conventional circuit arrangements of the aforementioned type typically have an (output) comparator, which, for the purpose of digitization, compares the signal level of the rectified analog signal obtained through demodulation to a reference value, the comparator threshold, and as a result supplies either a low level signal (logic "0") or a high level signal (logic "1"), depending on whether the analog signal level is below or above the comparator threshold. A logic that is inverted with respect to the foregoing is also possible. Since the rectified signal only slowly follows the input amplitude of the actual input signal, however, and the rising and falling edges often do not have the same steepness, the position of the comparator threshold has a strong influence on the time duration of the low phase ("0") or high phase ("1") of the digital signal produced. Especially in the case of low input levels, which are always overlaid with noise, the edges of the analog signal—especially the falling edges—are relatively flat and the absolute voltage changes are relatively small, so that the comparator threshold has a particularly strong influence on the time durations of the low and high phases of the digital signal.

The position of the threshold of the output comparator accordingly plays a critical role in the conversion of the rectified and demodulated analog signal into a digital signal, on which basis—as described above—the reductions of the amplitude-modulated time signal or their time durations are determined by the analysis unit for the purpose of extracting the time information contained therein. Nowadays the comparator threshold for the analog decoded time signal (TCO) is disadvantageously either set at a fixed level or is governed in an analog manner by the input amplitude. In this connection, it appears useful for low input levels to increasingly move the comparator threshold toward a maximum level of the analog signal, and to correspondingly lower it at high input levels. This approach has already been implemented in some types of integrated receiver circuits. However, such a tracking of the comparator threshold must be designed in a relatively modest manner, since no feedback is provided. In addition, this regulation as such must also be viewed as disadvantageous, since only the signal amplitude, and not the signal itself (the signal quality), is analyzed, which can lead to an erroneous reception of the time information. "Erroneous" means that during the duration of a received minute record, incorrect binary decisions are made which lead to an incorrect evaluation of at least one data bit of the minute record. The time derived from the received time signal would then no longer be correct.

SUMMARY OF THE INVENTION

It is therefore an object of the present invention to provide a method and a circuit arrangement such that improved system sensitivity is achieved in a receiver for receiving time signals. In particular, the frequency of occurrence of errors due to misreading of pulse lengths is to be reduced, and distorted received signals are to be detected better. Moreover, simple adaptation to different protocols (countries) is to be possible.

The object is attained in a method in that a characteristic value of the time duration of at least one signal phase of a specific signal level of the digital signal is compared to a target value, and in that a comparator threshold of the comparator is altered as a function of a result of the comparison such that the time duration of at least the applicable signal phase of the digital signal approaches the target value. In this connection, the characteristic value can in the simplest manner be the duration of the signal phase itself, in particular. However, the use of derived characteristic values is also possible, as described below.

In a circuit arrangement of the aforementioned type, the following are provided in order to attain the object: a storage device in which is stored at least one target value for the time duration of at least one signal phase of the time signal, a comparison unit that is in operative connection with the storage device and is designed to compare a characteristic value of the time duration of at least one signal phase of a certain signal level of the digital signal with the target value, and a changing unit that is in operative connection with the comparison unit and is designed to change a comparator threshold of the comparator as a function of a result of the comparison in the comparison unit, so that the time duration of at least the applicable signal phase of the digital signal can be adjusted to the target value.

In addition, the object is also attained by a radio clock that has such a circuit arrangement.

Accordingly, the invention is based on the fundamental idea of optimizing the lengths of the time-relevant signal pulses (decreases or increases) by regulation of the comparator threshold and by comparison of the time duration of the digital signal with stored target values. In a departure from the previous approaches to a solution, it is much more effective here in accordance with the invention to regulate the comparator threshold such that the threshold change is determined through the length of the digitized signal, i.e. through the time duration of certain signal phases of this signal. For example, in the case of the German time signal transmitter and the reception of decreases having a time duration of only 80 ms in place of the expected 100 ms, a lengthening of the low phases of the digital signal can be achieved by raising the comparator threshold (reduced excursion). Conversely, according to the invention, in the event decreases are received having a time duration of, e.g., 120 ms in place of the expected 100 ms, a shortening of the low phases of the digital signal is achieved by lowering the comparator threshold (increased excursion).

Accordingly, the following holds in general: The greater the excursion, the shorter the low phase. At the same time, however, there is also an increase in the certainty that an interference pulse, which is almost always observable as an increase in amplitude, will not lead to an erroneous change in the comparator threshold.

In an embodiment, provision is made according to the foregoing that the time duration of a low phase of the digital signal is compared to an appropriate target value, i.e., the duration of an amplitude decrease of the time signal. In a corresponding manner, a further embodiment of the inventive circuit arrangement provides that the threshold value is the time duration of an amplitude decrease of the time signal. In principle, however, it would also be possible to carry out the threshold adjustment using a comparison of high phases of the digital signal with corresponding amplitude maxima or amplitude increases of the time signal.

According to another embodiment, provision is made that the change in the comparator threshold takes place stepwise, which can be achieved by implementing the comparator threshold as a combination of a number of bits. A corresponding implementation of the inventive circuit arrangement provides that the changing unit is designed for stepwise changing of the comparator threshold. Thus, up to four different threshold values can be achieved by combining two bits. However, in practical implementation, more than eight threshold values (three bits) produce essentially no measurable improvement.

Additionally, provision can be made that an average value is produced for the comparison from a number of time durations of the relevant signal phase of the digital signal—preferably over a total time duration of several seconds, corresponding to the reception of several seconds bits of a time frame—so that excessively frequent switching of the comparator does not occur. Such an average value thus constitutes another example of a characteristic value of the time duration of a signal phase. To this end, as part of a further embodiment, the circuit arrangement has a calculating unit that is in operative connection with the comparison unit and is designed to determine the average value of a number of time durations of the relevant signal phase of the digital signal and to provide the average value in the comparison unit as a characteristic value.

In accordance with the above discussion, the time signal transmitters in different countries differ with regard to the duration and level of their signal decreases. These parameters, too, have an effect on the corresponding duration of the decrease (low phase) of the digital signal generated. It is thus important, especially in receivers for different protocols, to be able to use an optimal comparator threshold in each case. Switchover is thus of particular importance specifically in this context, wherein, the relevant target value is determined as a function of the time signal transmitter transmitting the time signal. Correspondingly, an embodiment of the inventive circuit arrangement provides that the analysis unit is designed to detect the time signal transmitter out of a number of time signal transmitters, and provides that an appropriate target value from the storage device can be provided in the comparison unit as a function of the detected time signal transmitter. Such a detection of time signal transmitters is described in the German patent application with the official application number 10357201.5, which corresponds to U.S. Publication No. 20050122952, and which are both incorporated herein by reference.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a coding scheme (time signal telegram) of a unit of coded time information transmitted by the time signal transmitter DCF-77;

FIG. 2 shows a section of an idealized, prior art transmitted DCF-77 time signal transmitter signal with multiple second pulses (seconds markers);

FIG. 3 is a detailed, schematic block diagram of a radio clock, according to an embodiment of the present invention;

DETAILED DESCRIPTION

Figure 4:
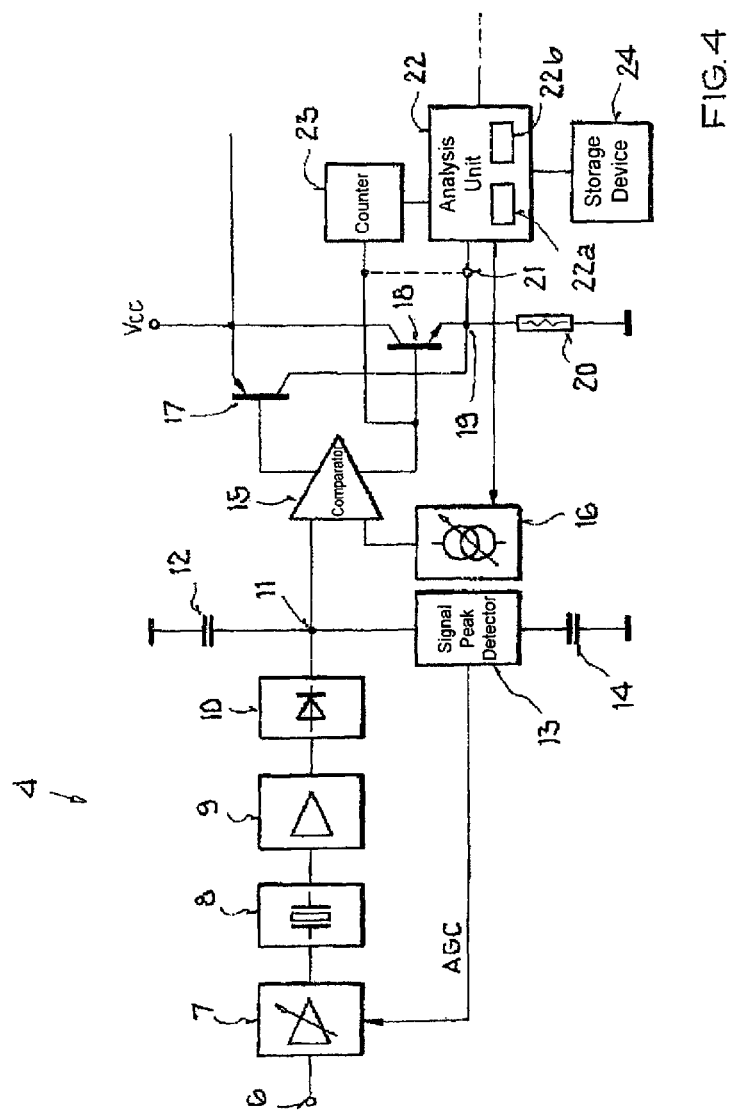
FIG. 4 is a schematic block diagram of the circuit arrangement from FIG. 3.

FIG. 3 shows a greatly simplified schematic block diagram of a radio clock 1. The radio clock 1 receives time signals X (see FIGS. 1, 2) from a time signal transmitter 2. To this end, the radio clock 1 has a receiving antenna 3, which is followed by a circuit arrangement 4 which is explained in detail below with reference to FIG. 4. The radio clock 1 also has, connected after the circuit arrangement 4, at least one display device 5, by which the time information obtained from the time signal X is displayed for a user of the radio clock 1.

FIG. 4 shows a more detailed schematic block diagram of the inventive circuit arrangement 4 from FIG. 3, which is designed to receive and process the time signal X (FIG. 3) of the German transmitter DCF-77. The circuit arrangement 4 has, firstly, an input 6 for the received time signal X, which is present here with a typical signal strength of approximately 0.5 µV. The input 6 is connected to a regulating amplifier 7 in order to amplify the input signal. Another input of the regulating amplifier 7 serves to supply a gain control signal AGC (Automatic Gain Control). A filter 8 is connected after the regulating amplifier 7 on the output side. The filter 8 can be piezoelectric in design and tuned to the frequency of the time signal transmitter 2 (FIG. 3). If the radio clock is designed to receive multiple different time signal transmitters 2, an appropriately switchable filter 8 is used here. The output of the regulating amplifier 7 is connected to the input of a post-amplifier 9 through the filter 8. The post-amplifier is followed by a rectifier 10, for example a diode circuit, so that an analog signal AS (FIG. 5a, b)—which results after rectification and demodulation of the originally received time signal X—is present at a node 11 that is located after the rectifier 10 and is connected to a first capacitor 12. To this end, the capacitor 12 in the present example embodiment, has a relatively small capacitance of approximately 22 nF and thus is used for PWM detection with respect to the coded time information contained in the time signal X. The signal strength of the amplified analog signal AS at the node 11 is on the order of magnitude of approximately 200 mV. The circuit arrangement 4 also has a signal peak detector 13 that is connected to the node 11 and is followed by a second, relatively larger capacitor 14 with a capacitance of, e.g., 2.2 µF. This capacitor 14 is used for AGC regulation, and in conjunction with the signal peak detector 13 produces the aforementioned gain control signal AGC for the regulating amplifier 7, known per se to those skilled in the art.

In addition, the node 11 is connected to the first input of a comparator 15 whose other input is connected to a controllable voltage source 16 which supplies an adjustable reference voltage for variable setting of the threshold of the comparator 15. In the exemplary embodiment in FIG. 4, the output of the comparator 15 is first connected to two switches in the form of two bipolar transistors 17 and 18 in such a manner that it is connected to the gate of the applicable transistor 17, 18 in each case. The transistor 17 is designed as a pnp transistor, and the transistor 18 is designed as an npn transistor, where the emitter of the former and the collector of the latter are connected to an operating voltage VCC. On the other side, the collector of the transistor 17 and the emitter of the transistor 18 are connected to a node 19, to which a pull-down resistor 20 is also connected. In this way, a digital signal DS (FIG. 5a, b) results at an output 21 of the digitizing circuit formed by the comparator 15 and the transistors 17, 18 as a function of the position of the analog signal AS with respect to the threshold of the comparator 15; said digital signal is defined to assume either a signal level corresponding to the operating voltage VCC (high level, logic "1"; known as "active high"), or a negligible signal level (low level, logic "0"). Within the framework of an alternative embodiment (not shown) of the circuit arrangement 4, the output of the comparator 15 is connected directly to the following analysis blocks 22, 23 (see below), so that the transistors 17, 18 and the resistor 20 shown in FIG. 4 are omitted, resulting in a simplified and more economical circuit construction.

Also connected to the output 21 is a digital analysis unit 22, which is responsible for extracting the time information from the digital signal DS in a manner known per se, and which also has a signal connection to the display unit 5 (FIG. 3) for displaying the extracted time information, which is only vaguely indicated in FIG. 4. According to the invention, the analysis unit 22 also has a comparison unit 22a and a calculating unit 22b, which preferably can be embodied in the form of software and whose function is explained in detail below. In addition, the circuit arrangement 4 also has a counter 23 and a storage device 24, each of which stands in operative connection with the analysis unit 22. The storage device additionally stands in operative connection with the controllable voltage source 16, in order to thus be able to directly influence the position of the comparator threshold in keeping with the essence of the present invention, wherein the voltage source 16 functions together with the analysis unit 22 as a changing unit for the comparator threshold according to the invention. The counter is additionally connected either directly to the output of the comparator 15 or (as shown in dashed lines) likewise to the output 21, and is designed to determine, in cooperation with the analysis unit 22, a time duration of signal phases (high or low) of the digitized signal DS (see below). The storage device 24 here is designed especially for storing target values for the time duration of the corresponding signal phases (decreases or increases X1, X2; see FIG. 2) in the time signal X of a plurality of known time signal transmitters, i.e., a decrease duration (low phase) of 100 to 200 ms for the German transmitter DCF-77.

As already mentioned, the circuit arrangement described above achieves, in particular, the amplification, rectification, and demodulation of the received time signal X (FIG. 3). After demodulation, an analog signal AS is available at the node 11 (FIG. 4) whose voltage follows the (modulated) amplitude of the time signal X as dictated by the capacitor 12. This so-called TCO signal is now digitized by means of the comparator 15. A low input level of the analog signal AS—below the comparator threshold that can be set through the controllable voltage source 16 by the analysis unit 12—results in a low level at the output 21, while a high input level correspondingly results in a high level. Since the rectified signal AS can only slowly follow the input amplitude of the time signal, however, and the signal edges often do not have the same steepness, the position of the threshold of the comparator 15 influences the duration of the low or high phases of the digital signal DS. Especially in the case of low input levels, which are always overlaid with noise, the edges of the analog signal are relatively flat and are associated with an only small absolute voltage change, so that the comparator threshold here has an especially strong influence on the digitized low and high phases. These circumstances are also represented graphically in FIG. 5a, b.

Figure 5A:
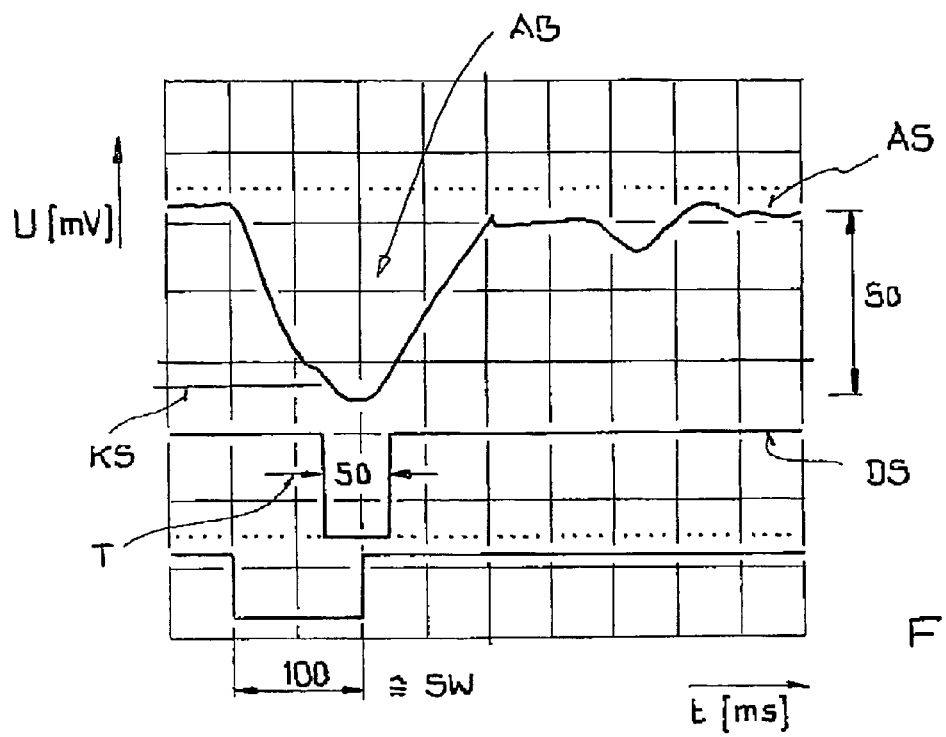
FIGS. 5a, b are signal behaviors of an analog input signal and a corresponding digitized output signal at the comparator of the circuit arrangement.

FIG. 5a shows the demodulated, rectified analog signal AS at the node 11 (FIG. 4) prior to digitization by the comparator 15. The signal voltage U in millivolt (mV) is plotted over the time t in milliseconds (ms). The signal AS is overlaid with noise, and in the region AB has a decrease corresponding to a certain decrease X1, X2 in the amplitude of the time signal X (see FIG. 2), which the analysis unit 22 should be able to determine from a suitably digitized signal. Also shown in FIG. 5a is a certain set comparator threshold KS of the comparator 15. As soon as the analog signal AS falls below the associated threshold voltage value, the voltage at the output 21 (FIG. 4) drops from its high level value to the low level value of zero, and then rises back to the high level value VCC when the comparator threshold KS is subsequently exceeded again. The resulting curve of the digital signal thus obtained is labeled with the reference symbol DS. The time duration T of the decrease (low phase) of the digital signal DS thus obtained is then measured quantitatively by the counter 23 (FIG. 4) and analyzed by the analysis unit 22 in that the comparison unit 22a undertakes a comparison with the target values SW stored in the storage device 24. In the example from FIG. 5a, the time duration T of the low phase found in this way is only about 50 ms, which is significantly less than the target value SW=100 ms for the German transmitter DCF-77. Preferably, the average value of suitable time durations T is now taken over multiple seconds markers of the time signal X, and compared to the associated target value as described above. If the analysis unit 22 then finds that the measured (average) value T deviates from the target value SW, it causes the voltage source 16 (FIG. 4) to raise the threshold of the comparator 15 in a stepwise manner by changing the reference voltage at said comparator, resulting in an extension of the duration of the low phase, as shown in FIG. 5a, until the time duration T of the low phase matches the target value SW within predefined limits. The following holds in general here: the closer the comparator threshold KS is to the target value SW, i.e., the essentially constant upper level value of the demodulated signal AS (low excursion), the longer the low phase of the digitized signal DS is. In contrast, the higher the excursion is, the shorter the low phase is. However, in the latter case it is more difficult for a noise pulse, which is practically always observable as an increase in the signal amplitude, to result in an erroneous switching of the comparator.

Figure 5B:
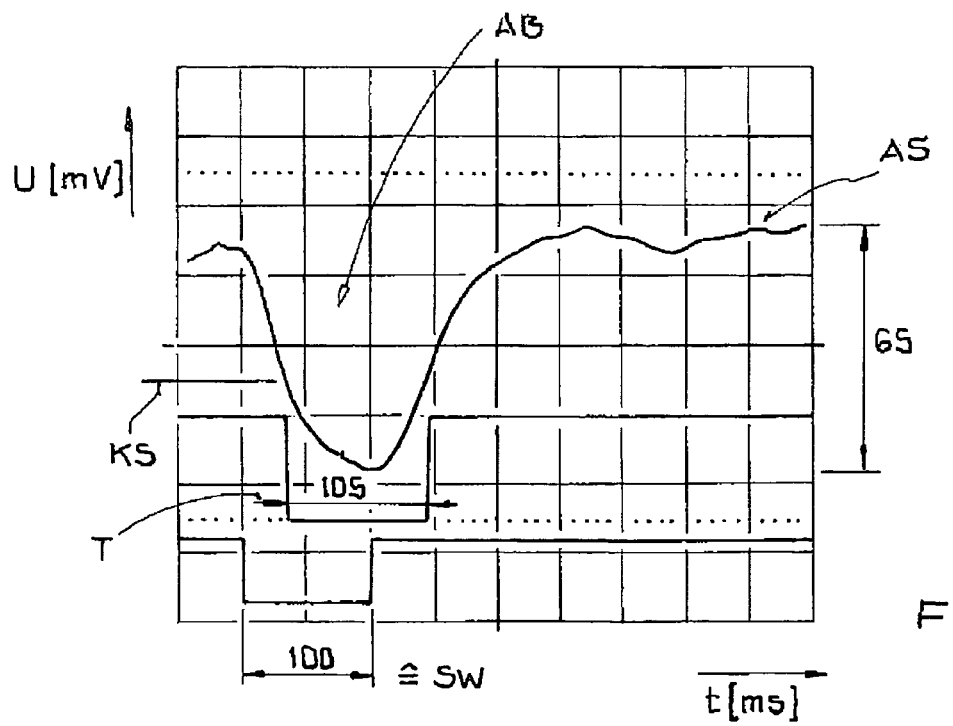

FIG. 5b shows, in corresponding fashion, the case in which the determined, if applicable averaged, time duration T of the low phase of the digital signal DS is approximately 105-110 ms, and is thus just barely above the 100 ms target value SW. Accordingly, it would be possible here to achieve an optimal approximation to the target value SW by slightly lowering the comparator threshold KS. Alternatively, however, on account of the good agreement already present between the two time durations (actual T and target SW), it would also be possible in such a case to undertake no further change in the comparator threshold, especially if a stepwise reduction in the comparator threshold KS would result in a drop below the target value SW.

Naturally, an analogous procedure can be followed with respect to the 200 ms low phase of the DCF signal or with respect to the corresponding durations of decrease in the other time signal transmitters mentioned above. In like manner, special "adaptation strategies" are possible for the range between the two expected durations of decrease contained in the time signal, for example when the measured duration of decrease lies precisely between, e.g., 100 ms and 200 ms, such as at 140-160 ms. In particular, it would then be possible to wait for a trend toward increasing or decreasing the time duration of the observed signal phase by waiting longer or performing extended averaging, and to prolong the threshold adjustment to this extent. Alternatively, it is also possible to take into account only the excessively short pulses of the short time duration and the excessively long pulses of the long time duration for the changes in the threshold in order to avoid incorrectly analyzing the values lying between these pulse durations.

In this way, an improved system sensitivity is achieved according to the invention in a receiver for receiving time signals. In particular, the frequency of occurrence of errors due to misreading of pulse lengths is reduced here, and distorted received signals are better detected as distorted on account of their temporal deviation from the applicable target value. In conjunction with prior art approaches to (automatic) detection of different time signal transmitters, moreover, simple adaptation to different protocols (countries) is possible. In addition, the inventive approach permits compensation of manufacturing tolerances of the various components in the described circuit arrangement in a simple manner.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method comprising:
receiving an amplitude-modulated time signal from a transmitter, the time signal comprising a plurality of markers representing time information, the amplitude-modulation of the time signal comprising modulation of an amplitude of a carrier of the time signal with a plurality of pulses, each pulse of the plurality of pulses corresponding to a respective marker and having a pulse width corresponding at least to a first pre-determined time duration representing a first binary value of the respective marker or a second pre-determined time duration representing a second binary value of the respective marker;
demodulating the amplitude-modulated time signal to provide an analog signal;
digitizing the demodulated analog signal by comparing the demodulated analog signal with one or more reference levels of a comparator;
extracting time information from the digitized demodulated time signal;
determining a characteristic value of one or more measured time durations of one or more first or second binary values of respective markers in the digitized demodulated time signal;
comparing the characteristic value with the first or second pre-determined time duration; and
adjusting one or more of the reference levels of the comparator based on the comparison of the characteristic value with the first or second pre-determined time duration.

2. The method of claim 1, wherein the adjusting one or more of the reference levels further comprises digitally adjusting one or more of the reference levels.

3. The method of claim 1, wherein the characteristic value is an average time duration of the one or more measured time durations.

4. The method of claim 1, wherein adjusting one or more of the reference levels of the comparator comprises continuing to adjust one or more of the reference levels until measured time durations of first or second binary values in the digitized demodulated time signal substantially match the first or second pre-determined time duration.

5. A circuit configured to:
receive an amplitude-modulated time signal from a transmitter, the time signal comprising a plurality of markers representing time information, the amplitude-modulation of the time signal comprising modulation of an amplitude of a carrier of the time signal with a plurality of pulses, each pulse of the plurality of pulses corresponding to a respective marker and having a pulse width corresponding at least to a first pre-determined time duration representing a first binary value of the respective marker or a second-pre-determined time duration representing a second binary value of the respective marker;
demodulate the amplitude-modulated time signal to provide an analog signal;
digitize the demodulated analog signal by comparing the demodulated analog signal with one or more reference levels of the comparator;
extract time information from the digitized demodulated time signal;
determine a characteristic value of one or more measured time durations of first or second binary values of respective markers in the digitized demodulated time signal;
compare the characteristic value with the first or second pre-determined time duration; and
adjust one or more of the reference levels of the comparator based on the comparison of the characteristic value with the first or second pre-determined time duration.

6. The circuit of claim 5, further configured to detects the time signal transmitter out of a plurality of time signal transmitters, and wherein an appropriate target value is provided as a function of the detected time signal transmitter.

7. The circuit of claim 5, further configured to digitally adjusts one or more of the reference levels of the comparator based on the comparison.

8. The circuit of claim 5, wherein the circuit is provided in a radio clock.

9. The circuit of claim 5, wherein the characteristic value is an average time duration of the one or more measured time durations.

10. The circuit of claim 5, wherein to adjust one or more of the reference levels of the comparator, the circuit is further configured to continue to adjust one or more of the reference levels until measured time durations of first or second binary values in the digitized demodulated time signal substantially match the first or second pre-determined time duration.

11. A system comprising:
means of receiving an amplitude-modulated time signal from a transmitter, the time signal comprising a plurality of markers representing time information, the amplitude-modulation of the time signal comprising modulation of an amplitude of a carrier of the time signal with a plurality of pulses of a carrier of the time signal, each pulse of the plurality of pulses corresponding to a respective marker and having a pulse width corresponding at least to a first pre-determined time duration representing a first binary value of the respective marker or a second pre-determined time duration representing a second binary value;
means for demodulating the amplitude-modulated time signal to provide an analog signal;
means for digitizing the demodulated analog signal by comparing the demodulated analog signal with one or more reference levels of a comparator;
means for extracting time information from the digitized demodulated time signal;
means for determining a characteristic value of one or more measured time durations of one or more first or second binary values of respective markers in the digitized demodulated time signal;
means for comparing the characteristic value with the first or second pre-determined time duration; and
means for adjusting one or more of the reference levels of the comparator based on the comparison of the characteristic value with the first or second pre-determined time duration.

* * * * *